United States Patent [19]

Rossi et al.

[11] Patent Number: 4,878,993
[45] Date of Patent: Nov. 7, 1989

[54] METHOD OF ETCHING THIN INDIUM TIN OXIDE FILMS

[75] Inventors: Barbara A. Rossi, Putnam Valley; Udayanath Mitra, Tarrytown, both of N.Y.

[73] Assignee: North American Philips Corporation, New York, N.Y.

[21] Appl. No.: 289,654

[22] Filed: Dec. 22, 1988

[51] Int. Cl.[4] .................. B44C 1/22; C03C 15/00; C03C 25/06; C23F 1/02

[52] U.S. Cl. ........................... 156/643; 156/646; 156/652; 156/655; 156/656; 156/659.1; 156/667; 204/192.35; 252/79.1

[58] Field of Search .............. 156/643, 646, 652, 655, 156/656, 657, 659.1, 667; 252/79.1; 204/192.3, 192.32, 192.34, 192.35, 192.37

[56] References Cited

U.S. PATENT DOCUMENTS

| | | | |
|---|---|---|---|
| 3,957,609 | 5/1976 | Sasano et al. | 204/192.32 |
| 3,979,240 | 4/1976 | Ghezzo | 156/667 X |
| 4,132,614 | 1/1979 | Cuomo et al. | 204/192.32 |
| 4,153,529 | 5/1979 | Little et al. | 204/192.32 X |
| 4,160,045 | 7/1979 | Longshore | 204/192.32 X |
| 4,620,898 | 11/1986 | Banks et al. | 204/192.32 X |
| 4,778,562 | 10/1988 | Chang | 156/667 X |

Primary Examiner—William A. Powell
Attorney, Agent, or Firm—Norman N. Spain

[57] ABSTRACT

A thin layer of indium tin oxide is deposited on a substrate and etched by ion reactive etching with a plasma consisting of disassociated argon.

19 Claims, 1 Drawing Sheet

METHOD OF ETCHING THIN INDIUM TIN OXIDE FILMS

BACKGROUND OF THE INVENTION

The invention in this case relates to a new and improved method of etching indium tin oxide films.

Finely patterned transparent, conductive layers are used in a number of optoelectronic and photovoltaic devices. These devices include displays, particularly actively addressable displays, heterojunction solar cells, color image pick up tubes, and electrochromic display devices.

Particularly for use in actively addressable displays and in heterojunction solar cells it is required that precisely defined patterns be formed, of line width and spacings of 2–4 microns or less exhibit a low sheet resistance of the order ($\leq 20$ ohms/square), an ohmic contact to the underlying substrate and good step coverage.

Recently, attempts have been made to form such patterns from thin indium tin oxide films. Thin indium tin oxide films may be readily produced by a number of techniques including reactive sputtering of a In:Sn target in $O_2$, direct sputtering of a $In_2SnO_3SnO_2$ target, reactive evaporation, ion beam sputtering and thermal evaporation. However the most useful has been shown to be direct sputtering from a target. By this method satisfactory thin films of indium tin oxide are readily produced.

However, attempts to produce fine line patterns (of the order of 2–4 microns or less) by known etching methods have not proved to be successful.

Thus, while wet etching methods including the use of such etchants as HI, HCL, oxalic acid, HCL with zinc powder dispersions and mixtures of HCl and $HNO_3$ can be used to etch indium tin oxide films, it was found that only mixtures of HCL and $HNO_3$ can be used to produce fine line etching of indium tin oxide films, a typical etch composition being 2:10:.04 by volume of $HCl:H_2O:HNO_3$.

It frequently has been found, however, that use of such an etch presents the problem in that frequent overetching results in breakage of the lines of the pattern.

Attempts have been made to employ plasma etching methods. The use of plasmas containing a gaseous carboxylic acid as shown in Japanese Patent No. 5902004 and plasmas containing a gaseous fluorine compound such as fluorine, hydrogen fluoride and carbon tetrafluoride shown in Japanese Patent No. 5903003 have not proved to be successful in that incomplete etching results due to the production of non-volatile compounds such as indium triflouride which stops further etching of the indium tin oxide and resultant production of electrical shorts have been found to result from the use of such etching method. In addition, the presence of an organic material, the carboxylic acid, in the plasma or carbon tetrafluoride results in the contamination of the device being produced.

Also, attempts have been made to etch indium tin oxide films by reactive ion etching in a plasma formed from argon containing an alcohol such as ethanol or methanol as shown in Japanese Disclosure No. 1985-234, 325. However, such methods have proved to be unsuccessful probably because organic side products are produced which contaminate the surface being etched and prevent proper etching.

SUMMARY OF THE INVENTION

A principal object of this invention is to provide an improved method of etching thin films of indium tin oxide deposited on a substrate.

Another object of this invention is to provide a method of providing precise thin patterns of indium tin oxide on a substrate.

These and other objects of the invention will be apparent from the following description.

According to an aspect of the invention a new and novel method of etching thin films of indium tin oxide deposited on a substrate comprises subjecting the film of indium tin oxide to reactive ion etching in an atmosphere consisting of disassociated argon where the disassociated argon is a mixture of argon ions and electrons.

According to an additional aspect of the invention precise patterns of indium tin oxide deposited on a substrate are obtained by subjecting thin films of indium tin oxide deposited on a substrate to a patterned reactive ion etching in an atmosphere consisting of disassociated argon. It has been found that by this method precise patterns of indium tin oxide, deposited on a substrate, free from discontinuities and having line widths and spacings in the order as little as 2–4$\mu$ or less may be readily produced.

It should be noted that Sassano et al. U.S. Pat. No. 3,957,609 suggests the formation of a fine pattern of tin oxide deposited on a substrate by subjecting a film of tin oxide deposited on a substrate to etching of ion sputtering which argon ions in an oxygen atmosphere. Moreover, there is no suggestion in this patent of etching a film of indium tin oxide by reactive ion etching in an atmosphere free of oxygen but consisting of disassociated argon.

DETAILED DESCRIPTION OF THE INVENTION

Figure 1A:
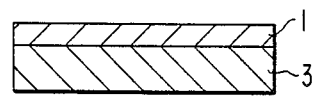
FIGS. 1$a$, 1$b$, 1$c$ and 1$d$ cross-section of the drawing show in longitudinal cross-section steps in the formation of a patterned electrode structure according to the method of the invention.

While the weight percentages may somewhat vary, the indium tin oxide employed in the method of the invention consists of a mixture by weight of from 90–95% of indium oxide and 10–5% tin oxide.

Any substrate that is etched by the ion reactive etching method of the invention at a substantially slower rate than indium tin oxide may be employed.

The substrate may be formed of insulating materials, semiconductor materials or metals. Examples of insulating materials that may be employed are silicon dioxide, silicon nitride, and borosilicate glass.

Examples of semiconductor materials are mono and polycrystalline silicon.

Examples of metals are aluminum, chromium and molybdenum.

An important aspect of the invention involves the formation of a fine transparent electrically conductive pattern formed of a transparent conductive film of indium tin oxide on a dielectric substrate.

According to the invention the formation of such a pattern is carried out according to the following procedure.

A thin layer of indium tin oxide is deposited on an electrically insulating substrate, the thickness of the indium tin oxide layer being preferably less than 0.5μ.

A thin layer of a dielectric material is then deposited on the indium tin oxide layer. The dielectric material is one that is capable of being etched at a significantly slower rate then indium tin oxide by ion reactive etching in a plasma consisting of disassociated argon. Examples of such materials include silicon dioxide, silicon nitride, germanium nitride and of these, silicon dioxide is preferred.

A photoresist having the desired pattern is formed on the layer of the dielectric material so as to leave exposed sections of the layer of dielectric material corresponding to the pattern. Any of the well known positive or negative acting photoresists may be employed, examples of which are Kodak 820, A21935, Kodak 809 and AZ1350J.

The exposed sections of the dielectric material are then removed by an etchant to which the photoresist pattern is comparative inert. For this purpose a gaseous etch is employed an example of which is a plasma consisting of a major portion of a halogenated methane, such as trifluoromethane, and oxygen.

The photoresist pattern is then removed, preferably by etching particularly with a gaseous etchant for example one consisting essentially of a plasma of oxygen. As a result of the removal of the photoresist pattern portions of the indium tin oxide are exposed. The exposed sections of indium tin oxide are then removed by being subjected to ion reactive etching in a plasma consisting of disassociated argon.

The dielectric material covering the remaining portions of the indium tin oxide is then removed by etching by use of an etchant. For this purpose a gaseous etchant of the type used previously to remove the original exposed sections of the dielectric material is preferably used.

As a result a fine pattern of indium tin oxide on an electrically insulating substrate is formed.

The fineness of the pattern depends upon the initial photoresist pattern employed. By this method thin precise transparent electrically conductive patterns of indium tin oxide free of electrical shorts and undercutting and of a line width and spacing of the order of 2–4μ or less. Even patterns with a line width and spacing as small as 0.5 it may be formed.

The invention will now be described in greater detail with reference to the following example and the drawing.

Referring to FIG. 1a of the drawing, a thin film of indium tin oxide 1 (of a thickness of about 0.2 microns)-/was sputter deposited from a indium tin oxide target in argon ambient on a four inch diameter quartz substrate 3. A 2000Å thick layer of plasma silicon dioxide 5 was deposited on the thin indium tin oxide film 1.

The deposition was carried out in a commercial parallel plate reactor manufactured by Plasma Therm (PT730 system) having an upper and lower electrode. The top electrode is powered by a 13.56 MHz high frequency generator. The gas flow is controlled by soft start mass flow controllers and enter the chamber via a showerhead design of the upper electrode. The process pressure is achieved by an MKS Instrument 252 throttle valve in conjunction with a roots blower and rotary vane mechanical pump. The system uses a turbo pump only during initial pump down to remove moisture from the system. Wafers are manually loaded and unloaded.

A positive-acting photoresist layer 7 was then deposited on the layer of the plasma silicon dioxide 5. The photoresist layer 7 was then subjected to patterned photolithography so as to provide a pattern photoresist layer 7 on the plasma silicon dioxide layer 5 containing lines of a width of about 4 microns and spacings of about 3 microns.

Figure 1B:
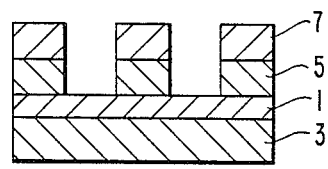

The resultant exposed sections of the plasma silicon dioxide layer 5 were subjected to a plasma consisting of 40 SCCM of triflouromethane in 2 SCCM of oxygen of 25° C. at a power of 250 watts at a frequency of 13.56 MHz for about 30 minutes. As a result, the exposed sections of the plasma silicon oxide layer 5 were removed and sections of the indium tin oxide film 1 were exposed. The resultant structure formed is as shown in FIG. 1b.

This structure was then subjected to a nitrogen purge.

The remaining photoresist layer 7 was then removed by etching by means of oxygen plasma etching employing about 70 SSCM of oxygen at a temperature of 25° C., at a power of 500 watts, a pressure of about 50 millitorrs and a frequency of about 13.5 MHz. This operation was carried out for about 50 minutes.

Figure 1C:
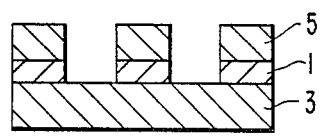

The resultant structure was then subjected to etching to remove the exposed sections of the indium tin oxide film 1 specifically by ion reactive etching in a plasma consisting of disassociated argon. This etching step was carried out consisting of 500 SCCM of argon at a temperature of 25° C. in an atmosphere with a power of 500 watts at a pressure of about 100 millitorrs at a frequency 13.5 MHz. Completion of this etching step was determined by the detection of the spectra peak at 325.65 nm. The resultant structure (which is shown in FIG. 1C) was again subjected to a nitrogen purge.

Finally the remaining portion of plasma silicon dioxide layer 5 was removed by etching in a manner similar to that previously carried out.

Figure 1D:
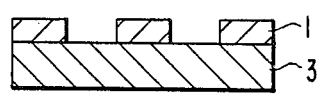

The resulting structure consisting of thin transparent electrodes of indium tin oxide 1 on the quartz 3 substrate is shown in FIG. 1d.

Both the plasma etching and the reactive ion etching steps were carried out in the apparatus used for plasma silicon dioxide etching.

What is claimed:

1. A method of etching a thin layer of indium tin oxide deposited on a substrate comprising subjecting said layer of indium tin oxide to ion reactive etching in a plasma consisting of disassociated argon.

2. The method of claim 1 wherein the substrate is formed of a semiconductor material.

3. The method of claim 1 wherein the substrate is formed of an insulating material.

4. The method of claim 1 wherein the substrate is formed of a material selected from the group consisting of silicon dioxide, silicon nitride, sapphire and borosilicate glass.

5. The method of claim 1 wherein the substrate is a metallic substrate.

6. The method of claim 5 wherein the substrate is formed of a metal selected from the group consisting of aluminum, chromium and molybdenum.

7. A method of forming a fine transparent, electrically conductive pattern of indium tin oxide on an electrically insulating substrate, said method comprising:
   (a) depositing a thin transparent layer of indium tin oxide on said substrate, (b) depositing a thin layer of a dielectric material capable of being etched at a significantly slower rate than indium tin oxide in a plasma consisting of disassociated argon on said layer of indium tin oxide, (c) forming a photoresist having the desired pattern on said layer of said dielectric material to thereby provide exposed sections of said layer of dielectric material, corresponding to said pattern on said layer of indium tin oxide, (d) subjecting said exposed sections of said layer of dielectric material to an etchant for said dielectric material to which said pattern of photoresist is comparatively inert to thereby form a pattern of said dielectric layer corresponding to said desired pattern covered by said photoresist pattern, (e) removing, said photoresist pattern, (f) subjecting said exposed sections of indium tin oxide to ion reactive etching in a plasma consisting of disassociated argon for a time sufficient to remove said exposed sections of indium tin oxide from said substrate, and (g) subjecting said pattern of said dielectric material to an etchant to which said indium tin oxide is comparatively inert to thereby remove said dielectric material from said indium tin oxide thereby providing said pattern of indium tin oxide on said electrically insulting substrate.

8. The method of claim 1 wherein the indium tin oxide consists, by weight, of from 90-95% indium oxide and 10-5% tin oxide.

9. The method of claim 7 wherein the indium tin oxide consists, by weight, of from 90-95% indium oxide and 10-5% tin oxide.

10. The method of claim 9 wherein the dielectric material is selected from the group consisting of silicon dioxide, silicon nitride and germanium nitride.

11. The method of claim 10 wherein the insulating substrate is selected from the group consisting of silicon dioxide, silicon nitride, sapphire and borosilicate glass.

12. The method of claim 11 wherein the pattern of the dielectric material is removed by a gaseous etch.

13. The method of claim 12 wherein the gaseous etch is a plasma of a mixture of a major portion of trifluoromethane and oxygen.

14. The method of claim 13 wherein the photoresist pattern is removed by etching.

15. The method of claim 14 wherein the photoresist pattern is removed by a gaseous etch consisting essentially of a plasma of oxygen.

16. The method of claim 15 wherein the dielectric material is silicon dioxide.

17. The method of claim 16 wherein a indium tin oxide layer of a thickness of up to about $0.5\mu$ is employed.

18. The method of claim 17 wherein the layer of said dielectric material has a thickness of up to about $0.5\mu$.

19. The method of claim 2 wherein the substrate is formed of monocrystalline or polycrystalline silicon.

* * * * *